United States Patent
Han et al.

(10) Patent No.: US 8,975,628 B2
(45) Date of Patent: Mar. 10, 2015

(54) THIN FILM TRANSISTOR ARRAY PANEL

(75) Inventors: Hye-Rim Han, Seongnam-si (KR); Byoung-Sun Na, Hwaseong-si (KR); Jae-Jin Song, Hwaseong-si (KR); Hyung-Jun Park, Seongnam-si (KR); Si Hyun Ahn, Cheonan-si (KR); Woo-Jung Shin, Ansan-si (KR)

(73) Assignee: Samsung Display Co., Ltd., Yongin (KR)

( * ) Notice: Subject to any disclaimer, the term of this patent is extended or adjusted under 35 U.S.C. 154(b) by 928 days.

(21) Appl. No.: 13/161,124

(22) Filed: Jun. 15, 2011

(65) Prior Publication Data

US 2012/0181539 A1    Jul. 19, 2012

(30) Foreign Application Priority Data

Jan. 17, 2011    (KR) .................. 10-2011-0004667

(51) Int. Cl.
*H01L 27/00*    (2006.01)
*H01L 27/12*    (2006.01)
*H01L 27/02*    (2006.01)

(52) U.S. Cl.
CPC .......... *H01L 27/124* (2013.01); *H01L 27/0288* (2013.01)
USPC ......................................................... 257/59

(58) Field of Classification Search
CPC ...................... H01L 27/1214; H01L 27/0248
USPC ..................................................... 257/59, 72
See application file for complete search history.

(56) References Cited

U.S. PATENT DOCUMENTS

| | | | |
|---|---|---|---|
| 5,818,750 A | 10/1998 | Manning | |
| 6,359,313 B1 | 3/2002 | Yang et al. | |
| 6,472,767 B1 | 10/2002 | Enders et al. | |
| 6,486,752 B1 | 11/2002 | Noguchi | |
| 7,291,871 B2 | 11/2007 | Lai | |
| 8,017,999 B2 * | 9/2011 | Suzuki | 257/355 |
| 2006/0092591 A1 * | 5/2006 | Yuan et al. | 361/91.1 |
| 2006/0109392 A1 * | 5/2006 | Park | 349/40 |
| 2006/0152470 A1 * | 7/2006 | Kim | 345/102 |
| 2007/0090410 A1 * | 4/2007 | Chen | 257/223 |
| 2008/0136986 A1 * | 6/2008 | Kim et al. | 349/40 |
| 2009/0045733 A1 | 2/2009 | Suh et al. | |
| 2009/0278123 A1 * | 11/2009 | Peng | 257/48 |
| 2009/0283775 A1 * | 11/2009 | Yamazaki et al. | 257/72 |
| 2010/0073587 A1 * | 3/2010 | Satoh | 349/40 |
| 2010/0238368 A1 | 9/2010 | Kim et al. | |
| 2011/0057898 A1 * | 3/2011 | Huang et al. | 345/173 |
| 2011/0057923 A1 * | 3/2011 | Yuki et al. | 345/212 |
| 2011/0058134 A1 * | 3/2011 | Inoue et al. | 349/139 |
| 2011/0148827 A1 * | 6/2011 | Ishida et al. | 345/204 |

FOREIGN PATENT DOCUMENTS

| | | |
|---|---|---|
| KR | 10-0299683 | 6/2001 |
| KR | 10-2004-0055249 | 6/2004 |

(Continued)

*Primary Examiner* — Nathan Ha
(74) *Attorney, Agent, or Firm* — H.C. Park & Associates, PLC

(57) ABSTRACT

The present invention relates to a thin film transistor array panel including: a substrate; gate lines formed on the substrate; and a gate driver formed on the substrate to apply gate signals to the gate lines. The gate driver includes a first wire and a second wire to transmit different signals, and at least one of the first wire and the second wire includes a static electricity preventing structure to prevent static electricity from accumulating between the first wire and the second wire.

15 Claims, 8 Drawing Sheets

(56) References Cited

FOREIGN PATENT DOCUMENTS

| KR | 10-0656902 | 12/2006 |
| KR | 10-0719916 | 5/2007 |
| KR | 10-0839754 | 6/2008 |
| KR | 10-0848555 | 7/2008 |

\* cited by examiner

THIN FILM TRANSISTOR ARRAY PANEL

CROSS-REFERENCE TO RELATED APPLICATION

This application claims priority to and the benefit of Korean Patent Application No. 10-2011-0004667, filed on Jan. 17, 2011, which is hereby incorporated by reference for all purposes as if fully set forth herein.

BACKGROUND OF THE INVENTION

1. Field of the Invention

Exemplary embodiments of the present invention provide a thin film transistor array panel, in which a gate driver is directly integrated.

2. Discussion of the Background

A display device includes: a display panel including a plurality of pixels to display an image and a plurality of display signal lines connected to a switching element included in each pixel; a gate driver to output a gate-on voltage and a gate-off voltage to gate lines of the display signal lines, to turn the switching elements on and off; and a data driver to output a data voltage to data lines of the display signal lines, to apply the data voltage to the pixels through the turned on switching elements.

These gate driver and data driver may be mounted on the display panel as an integrated chip. However, to reduce the size of the display device and to improve productivity, the gate driver can be integrated in the display panel by forming it and the switching element during the same process.

The gate driver substantially includes a plurality of stages connected to each other as a shift register and arranged in a line, and wires transmitting various signals input to the stages. When these wires are crossed or disposed close to each other, static charges may generate a current. As a result, elements such as the wires or the thin film transistor may be damaged.

The above information is only for enhancement of understanding of the background of the invention and therefore it may contain information that does not constitute prior art.

SUMMARY OF THE INVENTION

Aspects of the present invention protect a gate driver by reducing damage to a wire or an electric element, due to a static electricity.

Additional features of the invention will be set forth in the description which follows, and in part will be apparent from the description, or may be learned by practice of the invention.

A thin film transistor array panel, according to an exemplary embodiment of the present invention, includes: a substrate; a plurality of gate lines formed on the substrate; and a gate driver formed on the substrate to apply gate signals to the gate lines. The gate driver includes a first wire and a second wire for transmitting different signals. At least one of the first wire and the second wire includes a static electricity preventing structure to prevent electrostatic discharges from occurring between the first wire and the second wire. The first wire and the second wire may be insulated from and cross each other, and a width of the first wire may be larger than a width of the second wire.

A thin film transistor array panel, according to an exemplary embodiment of the present invention, includes a substrate, a plurality of gate lines formed on the substrate, and a gate driver formed on the substrate to apply gate signals to the gate lines. The gate driver includes a plurality of thin film transistors to generate the gate signal, and a dummy thin film transistor disposed adjacent to the thin film transistor. A channel width of the dummy thin film transistor may be larger than a channel width of the thin film transistor.

According to an exemplary embodiment of the present invention, the control signal lines and/or the output signal lines are configured to prevent the accumulation of static electricity, such that damage to the wires or the electric elements may be prevented, and the deterioration of the gate driver and the display panel may be reduced.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
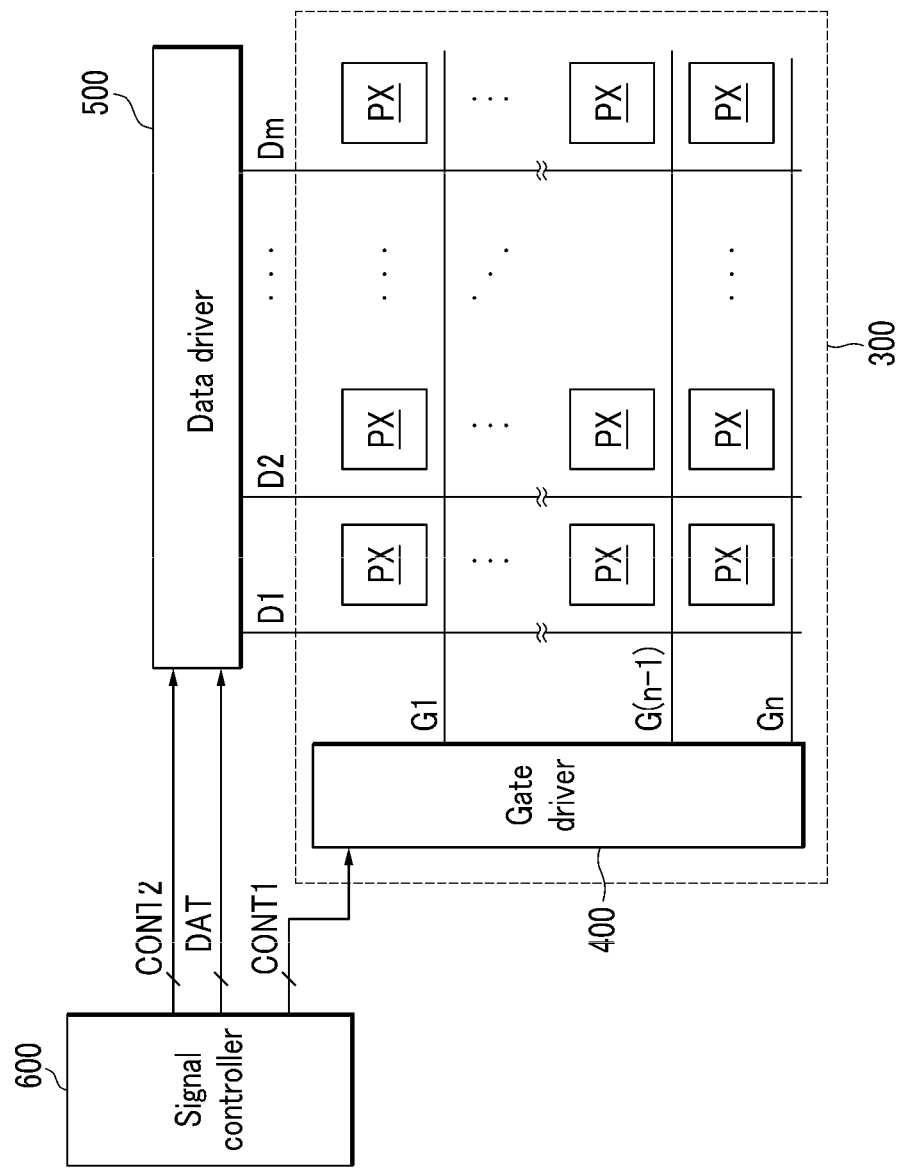
FIG. 1 is a block diagram of a display device, according to an exemplary embodiment of the present invention.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In the drawings, the thickness of layers, films, panels, regions, etc., are exaggerated for clarity. Like reference numerals designate like elements throughout the specification. It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present.

Figure 2:
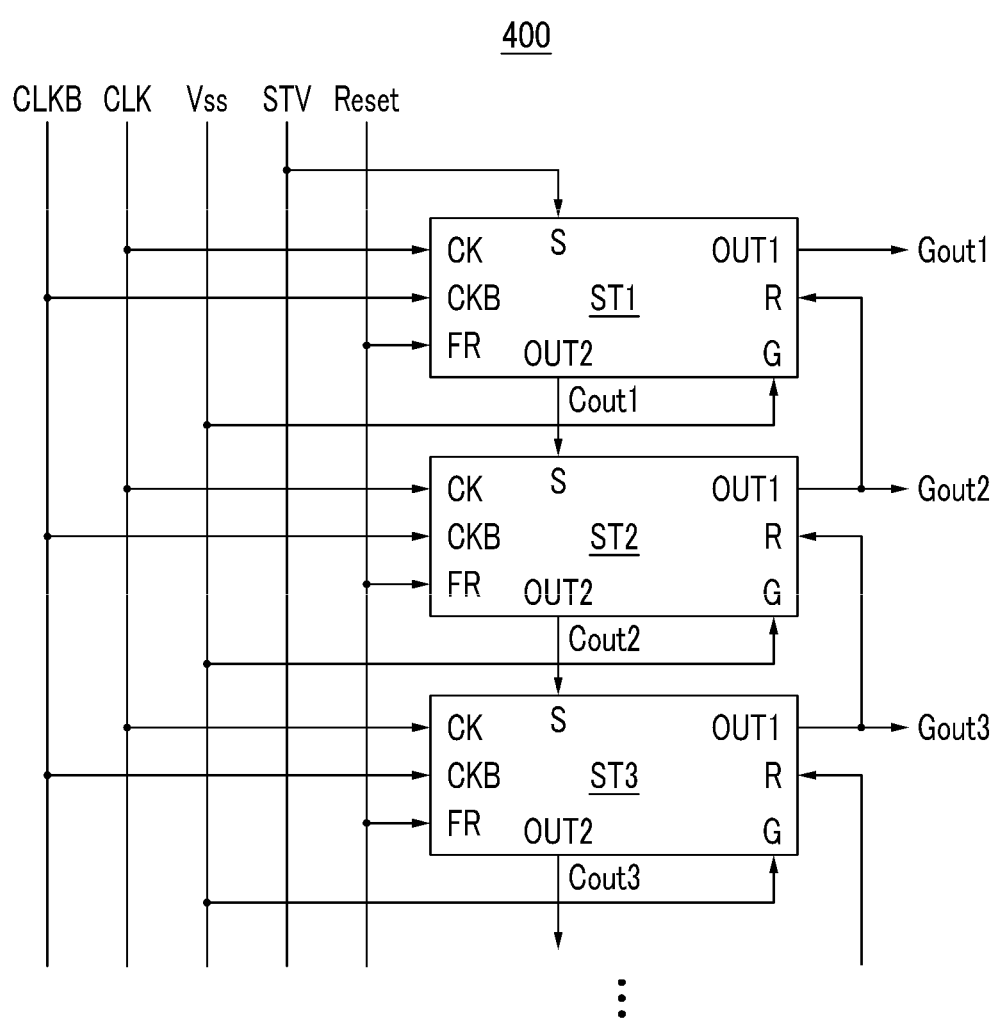
FIG. 2 is a block diagram of a gate driver, according to an exemplary embodiment of the present invention.

FIG. 1 is a block diagram of a display device, according to an exemplary embodiment of the present invention, and FIG. 2 is a block diagram of a portion of a gate driver 400 shown in FIG. 1. Referring to FIG. 1, the display device includes a thin film transistor array panel 300, the gate driver 400, a data driver 500, and a signal controller 600.

The thin film transistor array panel 300 includes a plurality of signal lines G1-Gn and D1-Dm and a plurality of pixels PX connected thereto and arranged in a matrix. The signal lines G1-Gn and D1-Dm include a plurality of gate lines G1-Gn to transmit gate signals (scanning signals) and a plurality of data lines D1-Dm to transmit data signals. Each pixel PX includes a switching element (not shown) connected to one of the signal lines G1-Gn and D1-Dm.

The gate driver 400 is connected to the gate lines G1 to Gn, and applies the gate signals, which include a gate-on voltage Von and a gate-off voltage Voff, to the gate lines G1 to Gn. The gate driver 400 may be referred to as a shift register and includes a plurality of stages respectively connected to the gate lines. The gate driver 400 and the switching elements of the pixels PX are formed by the same process and as such, are integrated on the thin film transistor array panel 300.

The data driver 500 is connected to the data lines D1-Dm of the display panel 300, and applies the data signal to the data lines D1-Dm. The data driver 500 receives a data control signal CONT2 from the signal controller 600 and a digital image signal DAT for a pixel PX of one row, to select a gray voltage corresponding to each digital image signal DAT. The data driver 500 converts the digital image signal DAT into an analog data signal, and applies the converted signal to the corresponding data lines D1-Dm.

The gate driver 400 receives the gate control signal CONT1 from the signal controller 600. The gate control signal CONT1 includes a scanning start signal STV, and at least one clock signal for controlling an output period of a gate-on voltage Von. The gate driver 400 applies the gate-on voltage Von to the gate lines G1-Gn, according to the gate control signal CONT1, to turn on the switching elements connected to the gate lines G1-Gn. Thus, the data signal applied to the data lines D1-Dm is applied to the corresponding pixel PX, through the turned-on switching element.

Referring to FIG. 2, the gate driver 400 includes a plurality of stages ST1, ST2, ST3, etc. that are dependently connected to each other and sequentially output gate signals Gout1, Gout2, Gout3, etc. The gate driver 400 includes a plurality of control signal lines to transmit various control signals (CLK, CLKB, Vss, STV, and Reset) input to the stages ST1, ST2, ST3, etc. Hereafter, the control signal lines are labeled according to the signals transmitted thereby.

For example, the control signal lines include a first clock signal line CLK to transmit the first clock signal CLK, a second clock signal line CLKB to transmit the second clock signal CLKB, a common voltage line Vss to transmit a common voltage Vss, a scanning start signal line STV to transmit the scanning start signal STV, and a reset signal line Reset to transmit the reset signal Reset. A duty ratio of the first clock signal CLK and the second clock signal CLKB is 50%, and a phase difference there between may be 180 degrees.

The control signal lines CLK, CLKB, Vss, STV, and Reset mainly extend in a longitudinal direction and may have connection lines extending in a transverse direction to the stages ST1, ST2, ST3, etc. Each of the stages ST1, ST2, ST3, etc. may each have a set terminal S, a common voltage terminal G, a first clock terminal CK, a second clock terminal CKB, a reset terminal R, and a frame reset terminal FR as input terminals, and a gate output terminal OUT1 and an output terminal OUT2 as output terminals.

The first clock terminal CK and the second clock terminal CKB of each stage ST1, ST2, ST3, etc. may receive the first clock signal CLK and the second clock signal CLKB, and the common voltage terminal G may receive the common voltage Vss. The gate output terminal OUT1 of each stage ST1, ST2, ST3, etc. outputs the gate outputs Gout1, Gout2, Gout3, etc. A carry output terminal OUT2 of the stages, except for a final stage (not shown), may output the carry outputs Cout1, Cout2, Cout3, etc. On the other hand, the set terminal S of the first stage ST1 may receive the scanning start signal STV, and the set terminal S of the remaining stages may receive the carry output of the previous stages, that is, the carry outputs Cout1, Cout2, Cout3, etc. The reset terminal R of each stage may receive the gate output of the subsequent stage, that is, the gate output Gout2, Gout3, etc. of the next stage, and the frame reset terminal FR may be input with the reset signal Reset.

Each stage of the gate driver 400 includes at least one thin film transistor and one capacitor connected to the various terminals S, G, CK, CKB, R, FR, OUT1, and OUT2. For example, the thin film transistors may be formed in a thin film transistor region, in which several thin film transistor units are gathered.

As described above, the gate driver 400 is integrated with the thin film transistor array panel 300 and includes the control signal lines CLK, CLKB, Vss, STV, and Reset, the electric elements connected thereto, such as the thin film transistor, and output signal lines outputting the output signals from the output terminals OUT1 and OUT2 of the stages.

Several static electricity preventing structures and/or electrostatic charge discharging structures of the gate driver 400, according to an exemplary embodiment of the present invention, will be described with reference to FIG. 3 to FIG. 11. Wires (indicated by "L") that will be described may be any of the various control signal lines CLK, CLKB, Vss, STV, and Reset connected to the input terminals S, G, CK, CKB, R, and FR of each of the stages, wires inside the stages, and/or output signal lines connected to the output terminals OUT1 and OUT2 of the stages.

Figure 3:
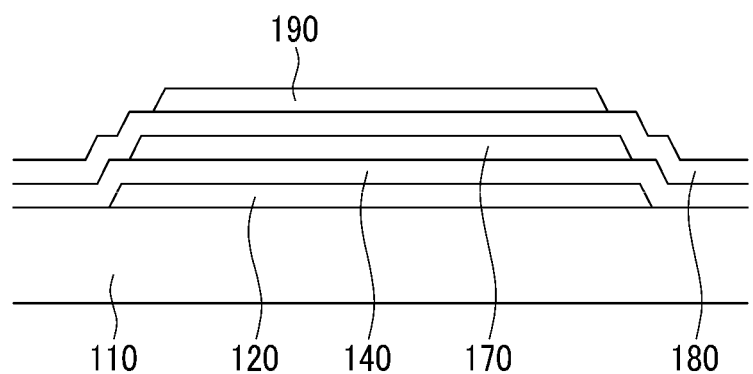
FIG. 3 is a cross-sectional view of a wire transmitting various signals of a gate driver, according to an exemplary embodiment of the present invention.

FIG. 3 is a cross-sectional view of wires transmitting various signals of a gate driver according to an exemplary embodiment of the present invention. FIG. 4, FIG. 5, FIG. 6, FIG. 7, FIG. 8, FIG. 9, and FIG. 10 are top plan views of wires and a contact portion of a gate driver, according to an exemplary embodiment of the present invention. FIG. 11 is an enlarged view of a thin film transistor region, a dummy thin film transistor region, and a thin film transistor unit of a gate driver, according to an exemplary embodiment of the present invention.

Referring to FIG. 3, a gate driver is integrated with a substrate 110. A first conductive layer 120, a first insulating layer 140, a second conductive layer 170, a second insulating layer 180, and a third conductive layer 190 are sequentially formed on the insulation substrate 110. The wires of the gate driver may be formed from one of the first, second, and third conductive layers 120, 170, and 190. When two wires are insulated from and cross each other, they may be insulated by one or two of the first and second insulating layers 140 and 180.

Figure 4:
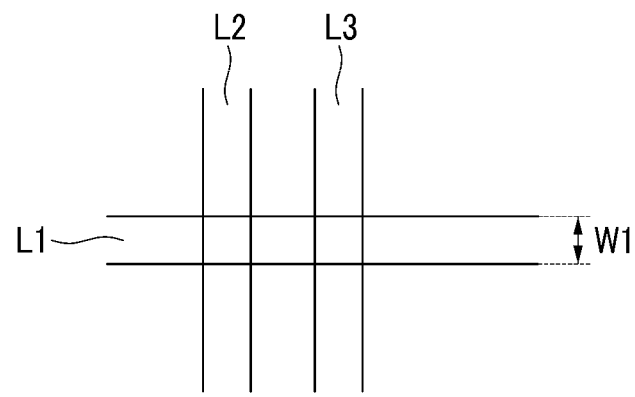
FIG. 4, FIG. 5, FIG. 6, FIG. 7, FIG. 8, FIG. 9, and FIG. 10 are top plan views of arrangements of wires and contact portions of a gate driver, according to exemplary embodiments of the present invention.

Referring to FIG. 4, the gate driver includes a first wire L1, a second wire L2, and a third wire L3. The second and third wires L2 and L3 are insulated from and cross the first wire L1. The first wire L1 may transmit a different signal from that of the second and third wires L2 and L3. The second wire L2 and the third wire L3 may transmit the same signals or different signals. The width W1 of the first wire L1 is greater than the widths of the second wire L2 and the third wire L3.

In detail, when the width of the second wire L2 and the third wire L3 is about 13 μm, the width W1 of the first wire L1 may be at least 15 μm. The width of the first wire L1 is wider than the overlapped wires L2 and/or L3, such that an electrostatic charge may be diffused, and damage to the wires L1, L2, and L3, due to electrostatic discharges, may be prevented. The first wire L1 may be the first clock signal line CLK or the second clock signal line CLKB, for example.

Figure 5:
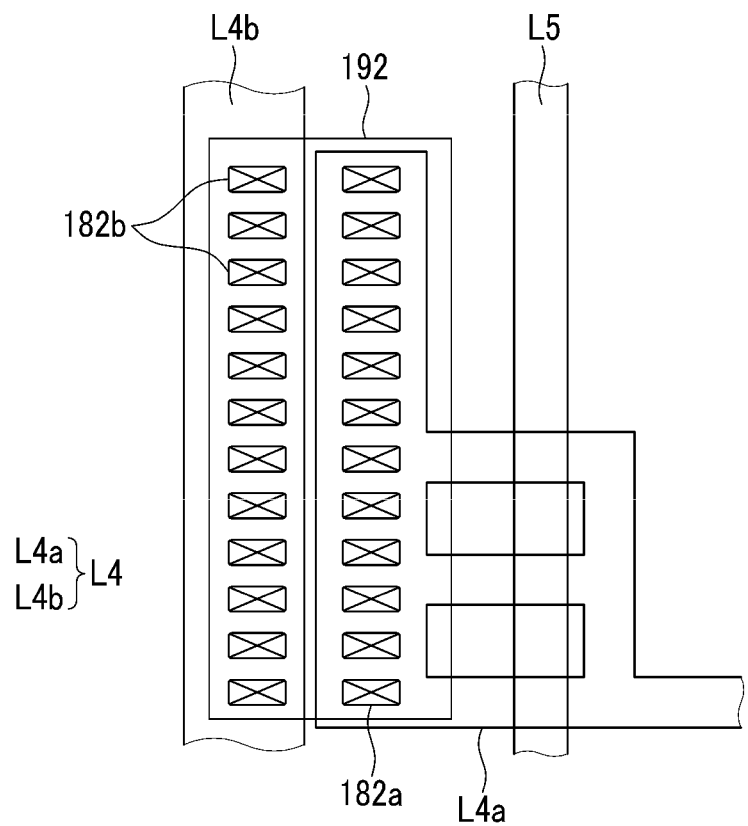

Referring to FIG. 5, the gate driver includes a fourth wire L4 and a fifth wire L5 that are insulated from and cross each other. The fourth wire L4 is branched into two or more wires where it crosses the fifth wire L5. Accordingly, electrostatic charge accumulation is distributed between the areas where the fifth wire L5 and the branches of the fourth wire L4 intersect. As such, the amount of electrostatic charge at any one portion of the fourth and fifth wires L4 and L5 is reduced, and may be easily discharged. Accordingly, electrostatic discharge damage to the wires may be prevented. Also, if one of the branches is damaged by an electrostatic discharge, the damaged branch may be removed, without affecting the operation of the display panel.

In FIG. 5, the fourth wire L4 is branched into three wires, however it may be branched into more than three wires. The fourth wire L4 includes two wire portions L4a and L4b that are positioned at different layers among the first conductive layer 120 and the second conductive layer 170 shown in FIG. 3. The two wire portions L4a and L4b are exposed by contact holes 182a and 182b formed in the first insulating layer 140 or the second insulating layer 180, and are connected to each other through the contact assistant 192 formed at the third conductive layer 190. This fourth wire L4 may be the common voltage line Vss.

Figure 6:
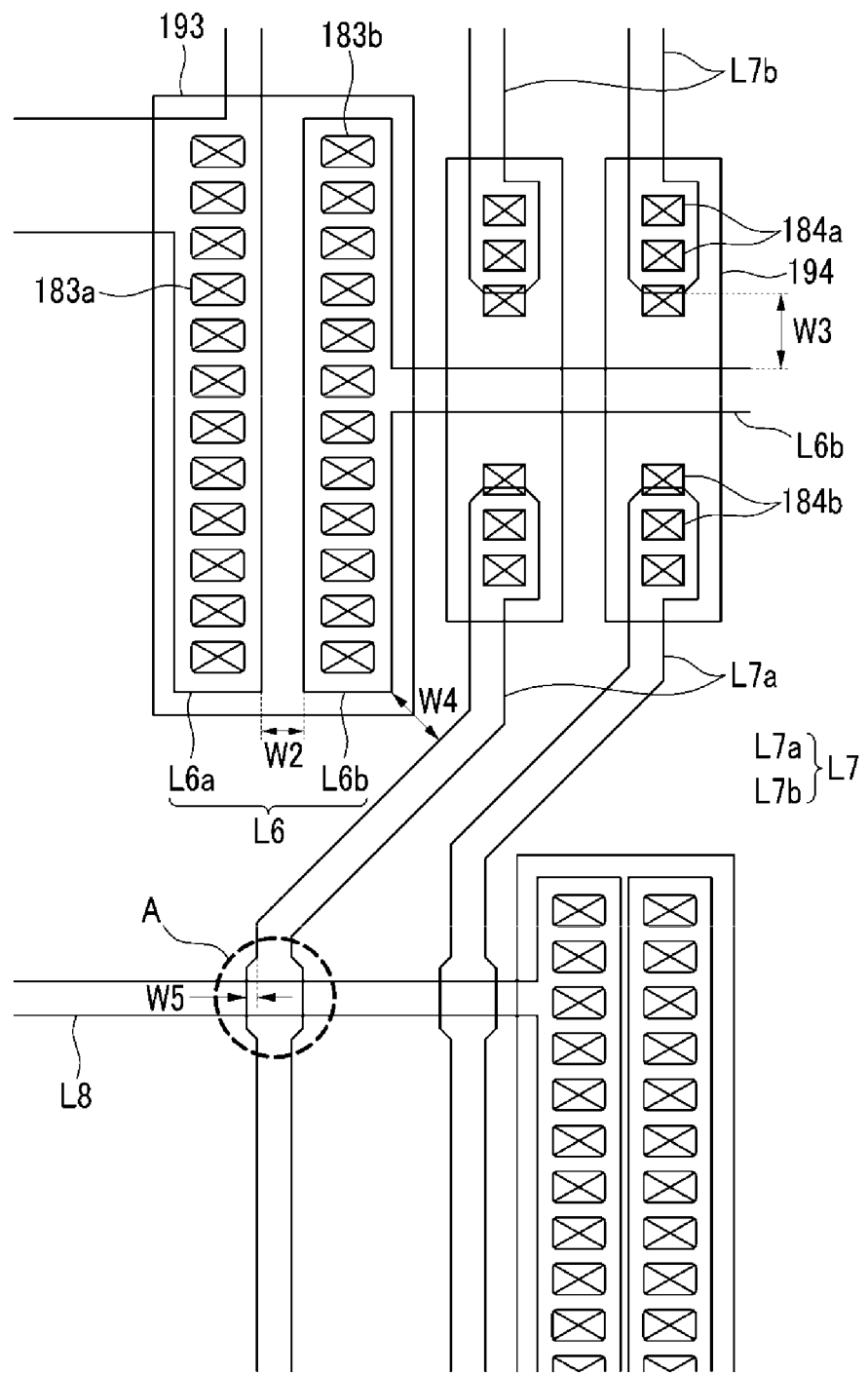
Figure 7:
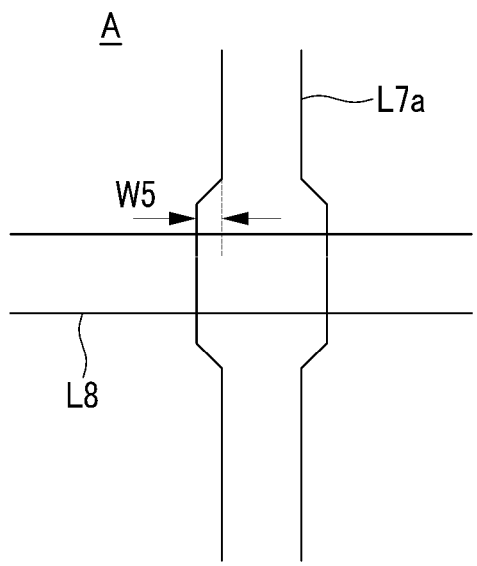

Referring to FIG. 6 and FIG. 7, the gate driver, according to an exemplary embodiment of the present invention, includes a sixth wire L6, a seventh wire L7, and an eighth wire L8. The sixth wire L6 includes two wire portions L6a and L6b that are positioned at different layers among the first conductive layer 120 and the second conductive layer 170 shown in FIG. 3. The two wire portions L6a and L6b are exposed by contact holes 183a and 183b formed in the first insulating layer 140 or the second insulating layer 180, and are connected to each other through the contact assistant 193 formed at the third conductive layer 190. The wire portion L6b extends in the transverse direction, except for a portion where the contact holes 183b are formed. A first distance W2 refers to the minimum distance between wire portions L6a and L6b of the sixth wire L6.

The seventh wire L7 includes two wire portions L7a and L7b extending in the longitudinal direction, which are connected to each other. The two wire portions L7a and L7b are positioned at the first conductive layer 120 or the second conductive layer 170 shown in FIG. 3 and may be positioned at the same layer. The two wire portions L7a and L7b are exposed by contact holes 184a and 184b formed in the first insulating layer 140 or the second insulating layer 180, and are connected by the contact assistant 194 formed at the third conductive layer 190. The ends of the wire portions L7a and L7b are expanded, and the corners of the expanded portions are chamfered or round. As described above, the corners of end portions of wires are chamfered or rounded, so as to form an obtuse angle. Therefore, electrostatic charges may be diffused and damage to the wires due to the electrostatic discharges may be reduced.

The wire portion L6b is insulated from and crosses the contact assistant 194 of the seventh wire L7. A second distance W3 refers to the minimum distance between the wire portion L6b and the expanded portion of the seventh wire L7. The second distance W3 is larger than the first distance W2. In particular, the second distance W3 may be at least about 35 µm.

As described above, in the portion where the contact holes 184a and 184b are formed, the distance between the ends of the wire portions L7a and L7b of the seventh wire L7 and the edge of the sixth wire L6 is more than a predetermined distance, such that damage to the wires due to electrostatic discharges be prevented. Also, the second distance W3 is larger than the first distance W2, such that an electrostatic charge flowing to the sixth wire L6 may flow to the contact portion of the two wire portions L6a and L6b of the sixth wire L6. In this case, the wire portions L6a and L6b contact the contact holes 183a and 183b, such that the same signal is transmitted there through. Accordingly, even though an electrostatic charge may accumulate, wire damage due to the static electricity does not occur.

The third distance W4 as the shortest distance between the wire portion L7a and the wire portion L6b may be at least 30 µm. As such, wire damage due to static electricity between the wire portion L6b and the wire portion L7a may be prevented.

The seventh wire L7 is extended in the longitudinal direction and insulated from and crosses the eighth wire L8. Referring to FIG. 7, at the intersection portion A of the seventh wire L7 and the eighth wire L8, the width of the wire portion L7a is increased. At the intersection portion A, wire portion L7a may protrude outwardly (i.e., include protrusions), such that the width of the wire portion L7a may be increased by from about 1 µm to about 3 µm. In particular, the added width W5 of the wire portion L7a at one side (the width of one of the protrusions) may range from about 0.5 µm to about 1.5 µm. In this case, the seventh wire L7 may be positioned above the eighth wire L8. In the present exemplary embodiment, the width of the seventh wire L7 is increased, such that the thickness of the seventh wire L7 is not significantly decreased due to a step difference caused by passing over the eighth wire L8. As a result, damage to the seventh wire L7 due to static electricity may be prevented.

In the exemplary embodiment of FIG. 6 and FIG. 7, the sixth wire L6 may be the gate output terminal OUT1, and the seventh wire L7 may be the wire connected to the gate terminal of the thin film transistor of the stage.

Figure 8:
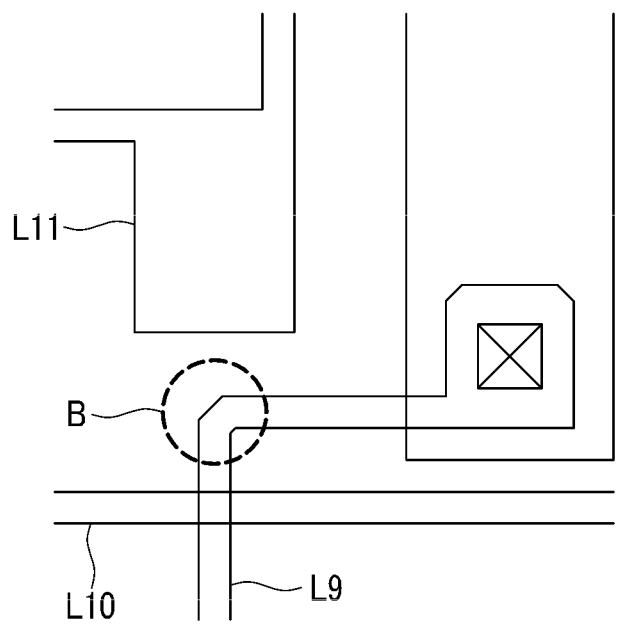

Referring to FIG. 8, a gate driver, according to an exemplary embodiment of the present invention, includes a ninth wire L9, a tenth wire L10, and an eleventh wire L11. The ninth wire L9 is insulated from and crosses the tenth wire L10, and is bent at a position B adjacent to the eleventh wire L11. However, the position B where the ninth wire L9 is bent does not include a sharply pointed corner. On the contrary, the position B is chamfered, such that it is substantially rounded. As such, the gathered electrostatic charges may not form damaging discharges.

Figure 9:
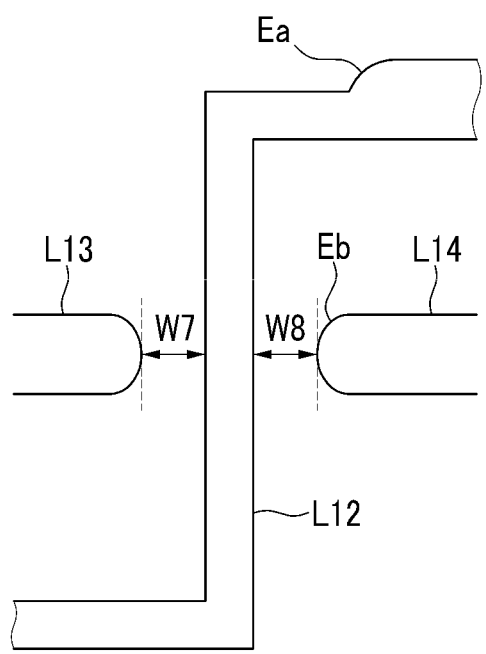

Next, referring to FIG. 9, a gate driver, according to an exemplary embodiment of the present invention, includes a twelfth wire L12, a thirteenth wire L13, and a fourteenth wire L14. A portion of the twelfth wire L12 is expanded and a corner Ea thereof is rounded. Accordingly the static electricity may be prevented from accumulating in the expanded portion.

The thirteenth wire L13 and the fourteenth wire L14 are disposed on opposing sides of the twelfth wire L12. Here, W7 refers to a distance between the thirteenth wire L13 and the twelfth wire L12, and W8 refers to a distance between the fourteenth wire L14 and the twelfth wire L12. The distances W7 and W8 are substantially equal to each other, such that accumulated electrostatic charge is not accumulated on one particular side. As such, wire damage is prevented. Also, ends of the thirteenth wire L13 and the fourteenth wire L14 are rounded, such that an electrostatic charge is not concentrated and may be discharged.

Figure 10:
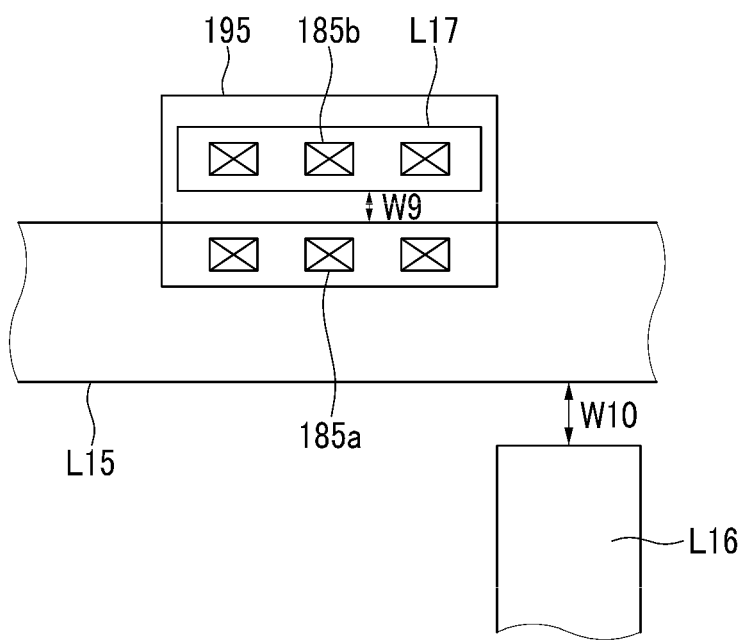
Figure 11:
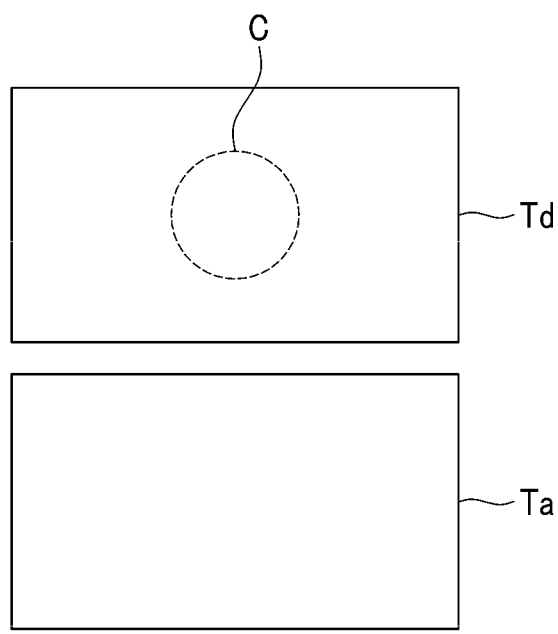
FIG. 11 is an enlarged view of a thin film transistor region, a dummy thin film transistor region, and one thin film transistor unit of a gate driver, according to an exemplary embodiment of the present invention.
Figure 11:
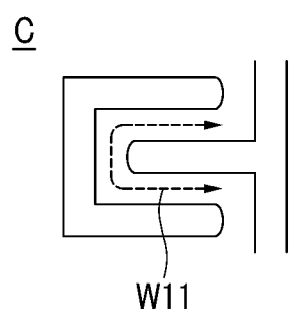

Referring to FIG. 10, a gate driver, according to an exemplary embodiment of the present invention, includes a fifteenth wire L15 and a sixteenth wire L16 that transmit different signals, and a dummy wire L17. The dummy wire L17 is formed beside the fifteenth wire L15. The dummy wire L17 and the sixteenth wire L16 may be formed at a different layer from the fifteenth wire L15. The dummy wire L17 and the sixteenth wire L16 may be formed on the same layer. The dummy wire L17 and the fifteenth wire L15 may be connected to each other through contact holes 185a and 185b formed in the first insulating layer 140 or the second insulating layer 180. The contact assistant 195 may be formed on the third conductive layer 190. However, the contact assistant 195 may be omitted. In this case, the dummy wire L17 may be floated.

A distance W9 between the dummy wire L17 and the fifteenth wire L15 is shorter than the distance W10 between the sixteenth wire L16 and the fifteenth wire L15. When the fifteenth wire L15 and the sixteenth wire L16 are adjacent to each other, the dummy wire L17 is formed alongside the fifteenth wire L15, such that electrostatic charges are gathered toward the dummy wire L17, rather than between the fifteenth wire L15 and the sixteenth wire L16. As a result, wire damage due to static electricity discharge between the fifteenth wire L15 and the sixteenth wire L16 may be prevented.

Referring to FIG. 11, a stage of a gate driver, according to an exemplary embodiment of the present invention, includes a thin film transistor region Ta, including a thin film transistor that generates a gate signal, and a dummy thin film transistor region Td adjacent thereto. A transistor of the dummy thin film transistor region Td may not be connected to any signal lines or wires. As described above, the dummy thin film transistor is formed such that the electrostatic charge may flow toward the dummy thin film transistor region Td.

Also, as shown in FIG. 11, a channel width W11 of the unit thin film transistor of the dummy thin film transistor region Td is greater than the channel width of the thin film transistor of the thin film transistor region Ta, such that electrostatic charges may flow toward the dummy thin film transistor region Td, and damage due to static electricity may be reduced in the thin film transistor region Td.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A thin film transistor array panel comprising:
a substrate;
gate lines disposed on the substrate; and
a gate driver integrated on the substrate to apply gate signals to the gate lines, the gate driver comprising a first wire to transmit a first signal and a second wire to transmit a second signal
wherein at least one of the first wire and the second wire comprises a static electricity preventing structure to prevent static electricity discharge from accumulating between the first wire and the second wire.

2. The thin film transistor array panel of claim 1, wherein:
the first wire and the second wire extend across each other; and
the width of the first wire is larger than the width of the second wire.

3. The thin film transistor array panel of claim 2, wherein the width of the first wire is at least 15 μm.

4. The thin film transistor array panel of claim 1, wherein:
the first wire and the second wire are insulated from each other; and
the first wire comprises at least two branch wires that extend across the second wire.

5. The thin film transistor array panel of claim 1, wherein:
the first wire and the second wire extend across each other; and
the first wire comprises opposing protrusions that increase the width of the first wire, at an intersection portion with the second wire.

6. The thin film transistor array panel of claim 5, wherein the widths of the protrusions range from about 0.5 μm to about 1.5 μm.

7. The thin film transistor array panel of claim 1, wherein the first wire comprises a chamfered or rounded bent portion disposed adjacent to the second wire.

8. The thin film transistor array panel of claim 1, further comprising a dummy wire disposed along the length direction of the first wire,
wherein the minimum distance between the dummy wire and the first wire is less than the minimum distance between the first wire and the second wire.

9. The thin film transistor array panel of claim 1, wherein the gate driver further comprises:
stages to apply the gate signals to the gate lines;
control signal lines to transmit control signals to the stages; and
output signal lines to receive output signals from the stages,
wherein the first wire and the second wire comprise at least one of the control signal lines, the output signal lines, and wires inside the stages.

10. The thin film transistor array panel of claim 4, wherein the first wire comprises three of the branch wires.

11. A thin film transistor array panel comprising:
a substrate;
an insulating layer disposed on the substrate;
gate lines disposed on the substrate; and
a gate driver disposed on the substrate to apply gate signals to the gate lines, the gate driver comprising:
a first wire to transmit a first signal and comprising a first wire portion and a second wire portion connected to the first wire portion, the first and second wire portions being disposed on different sides of the insulating layer;
a second wire to transmit a second signal and comprising a third wire portion and a fourth wire portion connected to each other by a contact assistant, wherein,
the first wire portion is disposed between the third wire portion and the fourth wire portion, and
the minimum distance between the third wire portion and the first wire portion is greater than the minimum distance between the first wire portion and the second wire portion.

12. The thin film transistor array panel of claim 11, wherein the minimum distance between the first wire portion and the third wire portion is at least 35 μm.

13. The thin film transistor array panel of claim 11, wherein the minimum distance between a corner of the first wire portion and the fourth wire portion is at least 30 μm.

14. A thin film transistor array panel comprising:
a substrate;
gate lines disposed on the substrate; and
a gate driver disposed on the substrate to apply gate signals to the gate lines, the gate driver comprising a first wire to transmit a first signal and a second wire to transmit a second signal, and
a third wire to transmit a different signal from the first wire, the third wire having an end that faces an end of the second wire, wherein,
the first wire extends between the end of the third wire and the end of the second wire, and at least one of the end of the second wire and the end of the third wire is rounded or chamfered.

15. The thin film transistor array panel of claim 14, wherein the minimum distance between the first wire and the end of the second wire is equal to the minimum distance between the first wire and the end of the third wire.

\* \* \* \* \*